United States Patent
Dawson et al.

[11] Patent Number: 5,963,803
[45] Date of Patent: Oct. 5, 1999

[54] METHOD OF MAKING N-CHANNEL AND P-CHANNEL IGFETS WITH DIFFERENT GATE THICKNESSES AND SPACER WIDTHS

[75] Inventors: Robert Dawson, Austin; Mark W. Michael, Cedar Park; Charles E. May, Austin, all of Tex.

[73] Assignee: Advanced Micro Devices, Inc., Sunnyvale, Calif.

[21] Appl. No.: 09/017,254

[22] Filed: Feb. 2, 1998

[51] Int. Cl.⁶ .................. H01L 27/02; H01L 21/8238
[52] U.S. Cl. .................. 438/231; 438/197; 438/275; 257/368; 257/369; 257/371
[58] Field of Search .................. 438/197, 231, 438/275, 585, 587, 588; 257/368, 369, 371

[56] References Cited

U.S. PATENT DOCUMENTS

| | | | |
|---|---|---|---|
| 4,085,498 | 4/1978 | Rideout | 29/571 |
| 4,651,406 | 3/1987 | Shimizu et al. | 438/275 |
| 4,764,477 | 8/1988 | Chang et al. | 438/231 |
| 4,978,626 | 12/1990 | Poon et al. | 438/220 |
| 5,460,993 | 10/1995 | Hsu et al. | 437/44 |
| 5,480,828 | 1/1996 | Hsu et al. | 438/275 |
| 5,882,993 | 8/1996 | Gardner et al. | 438/591 |
| 5,885,861 | 5/1997 | Gardner et al. | 438/231 |

OTHER PUBLICATIONS

Silicon Processing for the VLSI Era—vol. 3: The Submicron MOSFET by Stanley Wolf, Lattice Press, Sunset Beach, CA, 1995, pp. 311–313 and 641–643.

U.S. Patent Application Serial No.: 08/844,925, filed Apr. 21, 1997, entitled Method of Making Enhancement–Mode and Depletion –Mode IGFETs with Different Gate Thicknesses, by Gardner et al.

Primary Examiner—Charles Bowers
Assistant Examiner—David S Blum
Attorney, Agent, or Firm—Skjerven, Morrill, MacPherson, Franklin & Friel, L.L.P.

[57] ABSTRACT

A method of making N-channel and P-channel IGFETs with different gate thicknesses and spacer widths is disclosed. The method includes providing a semiconductor substrate with a first active region of a first conductivity type and a second active region of a second conductivity type, forming a first gate over the first active region and a second gate over the second active region, wherein the second gate has a substantially greater thickness than the first gate, forming first spacers in close proximity to opposing sidewalls of the first gate and second spacers in close proximity to opposing sidewalls of the second gate, wherein the second spacers have a substantially greater width than the first spacers due to the second gate having a substantially greater thickness than the first gate, and forming a first source and a first drain of the second conductivity type in the first active region and a second source and a second drain of the first conductivity type in the second active region. Preferably, the N-channel device is formed in the first active region, the P-channel device is formed in the second active region, and the N-channel and P-channel devices include lightly and heavily doped source and drain regions. In this manner, the relatively thick gate for the P-channel device reduces boron penetration, and the relatively wide spacers for the P-channel device offset the rapid diffusion of boron in the heavily doped source and drain regions of the P-channel device during high temperature processing so that the lightly doped source and drain regions for the N-channel and P-channel devices have the desired sizes.

33 Claims, 3 Drawing Sheets

METHOD OF MAKING N-CHANNEL AND P-CHANNEL IGFETS WITH DIFFERENT GATE THICKNESSES AND SPACER WIDTHS

BACKGROUND OF THE INVENTION

1. Field of the Invention

The present invention relates to integrated circuit manufacturing, and more particularly to insulated-gate field-effect transistors.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in order to modulate the longitudinal conductance of the channel.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide a gate. Thereafter, the gate provides an implant mask during the formation of source and drain regions by ion implantation, and the implanted dopants are driven-in and activated using a high-temperature anneal that would otherwise melt the aluminum.

An important parameter in IGFETs is the threshold voltage ($V_T$), which is the minimum gate voltage required to induce the channel to conduct. In general, the positive gate voltage of an N-channel device must be larger than some threshold voltage before a conducting channel is induced, and the negative gate voltage of a P-channel device must be more negative than some threshold voltage to induce the required positive charge (mobile holes) in the channel. There are, however, exceptions to this general rule. For example, depletion-mode devices already have a conductive channel with zero gate voltage, and therefore are normally on. With N-channel depletion-mode devices a negative gate voltage is required to turn the devices off, and with P-channel depletion-mode devices a positive gate voltage is required to turn the devices off As IGFET dimensions are reduced and the supply voltage remains constant (e.g., 3V), the electric field in the channel near the drain tends to increase. If the electric field becomes strong enough, it can give rise to so-called hot-carrier effects. For instance, electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The lightly doped drain reduces hot carrier effects by reducing the maximum lateral electric field. The drain is typically doped using two ion implants. A light implant is self-aligned to the gate, and a heavy implant is self-aligned to spacers adjacent to opposing sidewalls of the gate. The spacers are typically oxides or nitrides. The purpose of the lighter dose is to form a lightly doped region of the drain at the edge near the channel. The heavier dose forms a low resistivity heavily doped region of the drain. Since the heavily doped region is farther away from the channel than a conventional drain structure, the depth of the heavily doped region can be made somewhat greater without adversely affecting the device characteristics.

A known fabrication sequence includes implanting lightly doped source/drain regions using the gate as an implant mask, forming the spacers, and implanting heavily doped source/drain regions using the gate and spacers as an implant mask. Another known fabrication sequence includes forming disposable spacers, implanting heavily doped source/drain regions using the gate and spacers as an implant mask, removing the spacers, and implanting lightly doped source/drain regions (between the heavily doped source/drain regions and the gate) using the gate as an implant mask.

A drawback of lightly doped source and drain regions is that their light doping levels increase parasitic resistance. During operation, this parasitic resistance decreases drain current and switching speeds. Therefore, while the lightly doped drain should be large enough to adequately reduce hot carrier effects, the lightly doped source and drain should not be larger than necessary since this increases parasitic resistance.

Complementary metal-oxide semiconductor (CMOS) circuits include N-channel and P-channel devices. During CMOS manufacturing, the gates for the N-channel and P-channel devices are typically formed by depositing a blanket layer of polysilicon over the substrate, forming a photoresist layer over the polysilicon layer, etching and removing portions of the polysilicon layer beneath openings in the photoresist layer, and stripping the photoresist layer. Thereafter, the spacers for the N-channel and P-channel devices are typically formed by depositing a blanket layer of spacer material over the substrate, and then applying an anisotropic etch. Arsenic and/or phosphorus are often used to dope the source and drain for the N-channel device, and boron is often used to dope the source and drain for the P-channel device. Since the gates for the N-channel and P-channel devices typically have identical thicknesses, the spacers for the N-channel and P-channel devices typically have identical sizes.

Boron, however, tends to diffuse into silicon more rapidly than phosphorus and far more rapidly than arsenic during high temperature processing. As a result, after the lightly and heavily doped source and drain regions are implanted into the N-channel and P-channel devices, as the high-temperature anneal is applied to drive-in and activate the implanted dopants, the heavily doped source and drain regions for the P-channel device tend to exhibit far more lateral diffusion than the heavily doped source and drain regions for the N-channel device. This can result in smaller lightly doped source and drain regions for the P-channel device than for the N-channel device. Accordingly, complications may arise with obtaining lightly doped source and drain regions having the desired size for both the N-channel and P-channel devices.

For instance, if the spacers are relatively large, then the lightly doped source and drain regions for the P-channel device may be suitably sized, but the lightly doped source and drain regions for the N-channel device may be larger than necessary, resulting in increased parasitic resistance that decreases drive current and switching speeds. On the other hand, if the spacers are relatively small, then the lightly doped source and drain regions for the N-channel device may be suitably sized, but the lightly doped source and drain regions for the P-channel device may be smaller than desired, resulting in increased hot carrier effects that disrupt the threshold voltage.

Furthermore, a problem encountered in P-channel devices with polysilicon gates containing a high concentration of boron is that when a thin gate oxide is used, poor threshold voltage control may arise due to unwanted boron penetration into the gate oxide, or further, into the underlying channel region. It is reported that boron will penetrate gate oxides that are less than 125 angstroms thick during a 900° C. 30-minute post-implant anneal in nitrogen. It has also been found that the presence of fluorine in the gate oxide worsens the boron penetration problem. Such fluorine can be introduced into the gate oxide if boron difluoride ($BF_2$) is the implant species. Unfortunately, in some instances, the boron penetration may severely disruption the threshold voltage.

Nitrided oxides and reoxidized nitrided oxides have been used to reduce boron penetration. Likewise, nitrogen has been implanted into gate oxides to reduce boron penetration. For instance, a heavy nitrogen dose ($1 \times 10^{15}$ atoms/cm$^2$) can result in the gate oxide incorporating high concentrations of nitrogen that suppress boron penetration of the gate oxide. There are, however, drawbacks to these approaches. For instance, $NH_3$ nitridation incorporates hydrogen in the oxide, which increases electron trapping in the oxide. Reoxidized nitrided oxide is unable to eliminate the nitridation induced electron traps. Although electron trapping can be reduced by using a very light nitridation, the resulting oxide does not show sufficient resistance to boron penetration. Similarly, $N_2O$ nitrided and $N_2O$ grown oxides may not contain sufficient nitrogen to prevent boron penetration. Finally, implanting nitrogen into the gate oxide may not achieve the desired nitrogen concentration in the gate oxide, particularly as the gate oxide becomes extremely thin.

Accordingly, a need exists for an improved method of making N-channel and P-channel IGFETs that provides improved control over the sizes of lightly doped source and drain regions and reduces boron penetration.

SUMMARY OF THE INVENTION

An object of the present invention is provide an improved method of making N-channel and P-channel IGFETs that addresses the forementioned need.

In accordance with one aspect of the invention, a method of making N-channel and P-channel IGFETs includes providing a semiconductor substrate with a first active region of a first conductivity type and a second active region of a second conductivity type, forming a first gate over the first active region and a second gate over the second active region, wherein the second gate has a substantially greater thickness than the first gate, forming first spacers in close proximity to opposing sidewalls of the first gate and second spacers in close proximity to opposing sidewalls of the second gate, wherein the second spacers have a substantially greater width than the first spacers due to the second gate having a substantially greater thickness than the first gate, and forming a first source and a first drain of the second conductivity type in the first active region and a second source and a second drain of the first conductivity type in the second active region.

Preferably, the first and second gates are formed by forming a gate material over the first and second active regions, forming a first etch mask over the gate material with openings above a first portion of the gate material over the first active region and openings above a second portion of the gate material over the second active region, etching the gate material through the openings in the first etch mask to form a first pillar from an unetched portion of the gate material over the first active region and the second gate from an unetched portion of the gate material over the second active region, removing the first etch mask, forming a second etch mask over the substrate with an opening above all of the first pillar while covering all of the second gate, and etching the first pillar through the opening in the second etch mask to remove an upper portion of the first pillar to form the first gate over the first active region without removing essentially any of the second gate.

It is also preferred that the first active region is a P-type active region for the N-channel device, and the second active region is an N-type active region for the P-channel device.

The preferred approach for forming the sources and the drains includes implanting a light dose of an N-type dopant into the P-type active region using the first gate as an implant mask, implanting a light dose of a P-type dopant into the N-type active region using the second gate as an implant mask, forming the first and second spacers, implanting a heavy dose of an N-type dopant into the P-type active region using the first gate and the first spacers as an implant mask, and implanting a heavy dose of a P-type dopant into the N-type active region using the second gate and the second spacers as an implant mask.

As exemplary materials, the gates are polysilicon, the spacers are silicon dioxide, the etch masks are photoresist, the N-type dopant is phosphorus and/or arsenic, and the P-type dopant is boron.

Advantageously, the relatively thick gate for the P-channel device reduces boron penetration, and the relatively wide spacers for the P-channel device offset the rapid diffusion of boron in the heavily doped source and drain regions for the P-channel device during high temperature processing so that the lightly doped source and drain regions for the N-channel and P-channel devices have the desired sizes.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
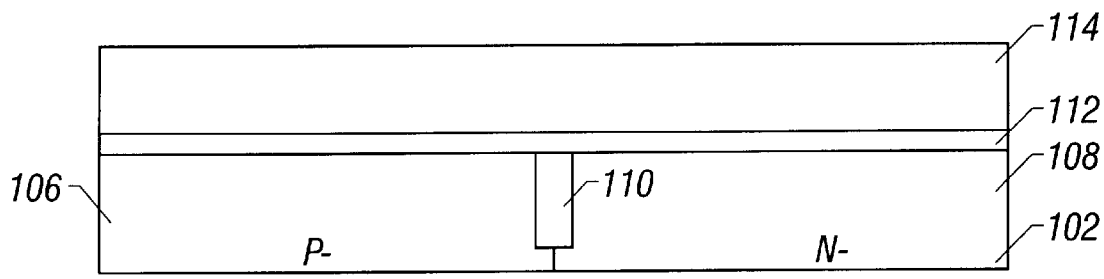
FIGS. 1A–1L show cross-sectional views of successive process steps for making N-channel and P-channel devices with different gate thicknesses and spacer widths in accordance with an embodiment of the invention.

In the drawings, depicted elements are not necessarily drawn to scale and like or similar elements may be designated by the same reference numeral throughout the several views.

In FIG. 1A, silicon substrate 102 suitable for integrated circuit manufacture is provided. Substrate 102 includes a P– type epitaxial surface layer on a P+ base layer (not shown). Substrate 102 also includes P– active region 106 and N– active region 108 in the epitaxial surface layer and adjacent to a planar top surface. Active region 106 is a P-well with a boron background concentration on the order of $1\times10^{16}$ atoms/cm$^3$, a <100> orientation and a resistivity of 12 ohm-cm. Active region 108 is an N-well with an arsenic background concentration on the order of $1\times10^{16}$ atoms/cm$^3$, a <100> orientation and a resistivity of 12 ohm-cm. Active regions 106 and 108 may be subjected to suitable threshold adjust and/or punchthrough implants, as is conventional. Trench oxide 110, composed of silicon dioxide (SiO$_2$), extends into a trench in substrate 102, and provides dielectric isolation between active regions 106 and 108. A blanket layer of gate oxide 112, composed of silicon dioxide, is formed on the top surface of substrate 102 using tube growth at a temperature of 700 to 1000° C. in an O$_2$ containing ambient. Gate oxide 112 has a thickness in the range of 30 to 100 angstroms. Thereafter, polysilicon layer 114 is deposited by low pressure chemical vapor deposition on the top surface of gate oxide 112. Polysilicon layer 114 is undoped and has a thickness of 2000 angstroms. If desired, polysilicon layer 114 can be doped in situ as deposition occurs, or doped immediately after deposition by implanting arsenic with a dosage in the range of $1\times10^{15}$ to $5\times10^{15}$ atoms/cm$^2$ and an energy in the range of 2 to 10 kiloelectron-volts. However, it is generally preferred the polysilicon be initially doped during later processing steps.

Figure 1B:
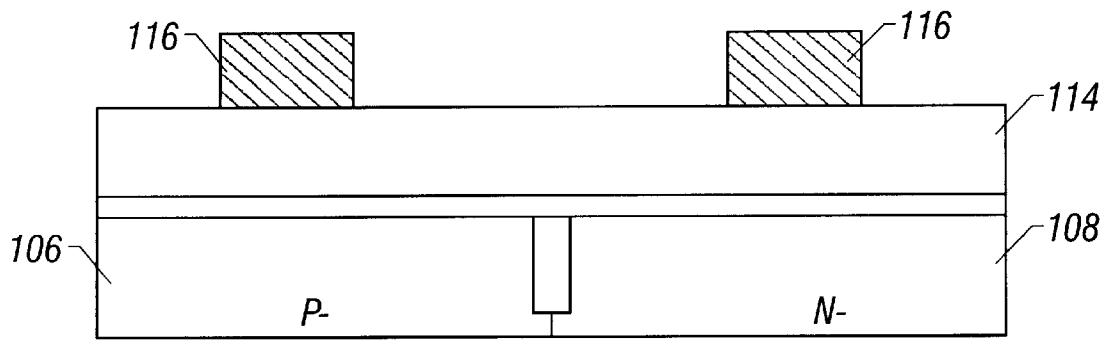

In FIG. 1B, photoresist layer 116 is deposited on polysilicon layer 114. A photolithographic system, such as a step and repeat optical projection system which generates deep ultraviolet light from a mercury-vapor lamp, uses a first reticle to irradiate photoresist layer 116 with a first image pattern. Thereafter, the irradiated portions of photoresist layer 116 are removed, and photoresist layer 116 includes openings above selected portions of active regions 106 and 108. For illustration purposes, the minimum resolution of the photolithographic system, and thus the distance between the openings in photoresist layer 116, is about 3500 angstroms (0.35 microns).

Figure 1C:
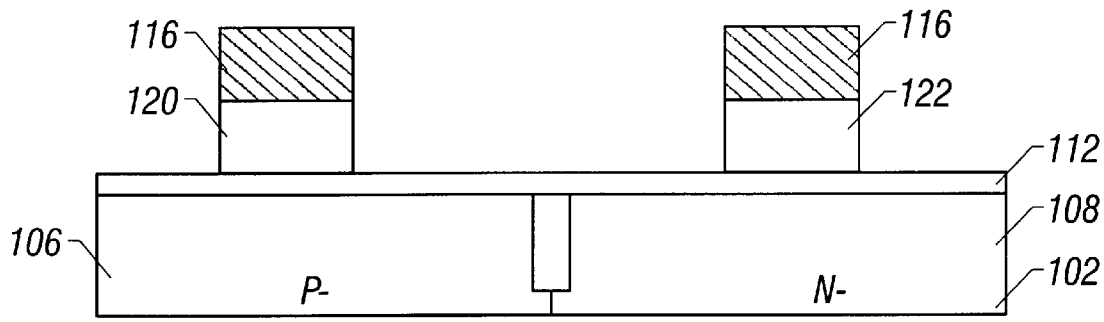

In FIG. 1C, an anisotropic dry etch is applied using photoresist layer 116 as an etch mask. Photoresist layer 116 protects the underlying regions of polysilicon layer 114, and the etch removes the regions of polysilicon layer 114 beneath the openings in photoresist layer 116. The etch is highly selective of polysilicon layer 114 with respect to gate oxide 112, so only a negligible amount of gate oxide 112 is removed and substrate 102 is unaffected. The etch forms pillar 120 from the unetched portion of polysilicon layer 114 over device region 106, and gate 122 from the unetched portion of polysilicon layer 114 over device region 108. Pillar 120 and gate 122 each have opposing vertical sidewalls separated by a length of 3500 angstroms, and a thickness (or height above the underlying gate oxide 112) of 2000 angstroms. Pillar 120 includes an upper level and a lower level. The upper level shall be removed so that the lower level forms a gate over active region 106, as described below.

Figure 1D:
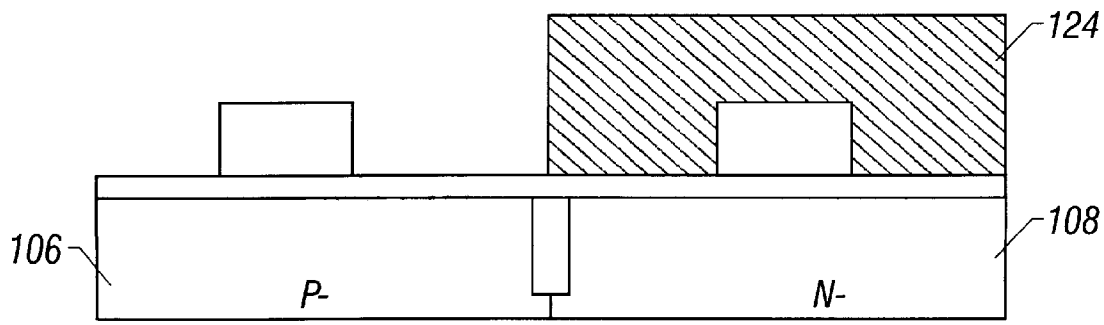

In FIG. 1D, photoresist layer 116 is stripped, and photoresist layer 124 is deposited over substrate 102. The photolithographic system uses a second reticle to irradiate photoresist layer 124 with a second image pattern. Thereafter, the irradiated portions of photoresist layer 124 are removed so that photoresist layer 124 includes an opening over the entire active region 106 while photoresist layer 124 covers the entire active region 108.

Figure 1E:
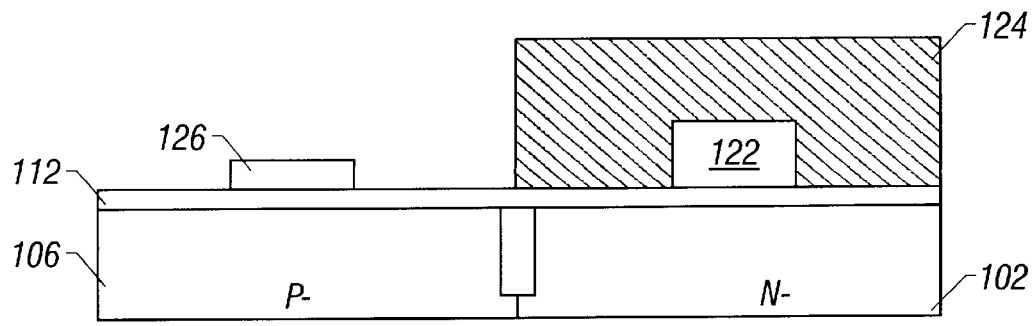

In FIG. 1E, an anisotropic dry etch is applied using photoresist layer 124 as an etch mask. The etch is highly selective of polysilicon with respect to silicon dioxide, so only a negligible amount of gate oxide 112 is removed and substrate 102 is unaffected. The dry etch is carefully timed so that it removes the upper 800 angstroms of pillar 120 while leaving the lower 1200 angstroms of pillar 120 intact. The remaining lower level of pillar 120 forms gate 126. Thus, gate 126 is an unetched portion of polysilicon layer 114 over device region 106 with opposing vertical sidewalls separated by a length of 3500 angstroms and a thickness of 1200 angstroms. Furthermore, since photoresist layer 124 protects gate 122 from the etch, gate 122 is unaffected by the etch.

Figure 1F:
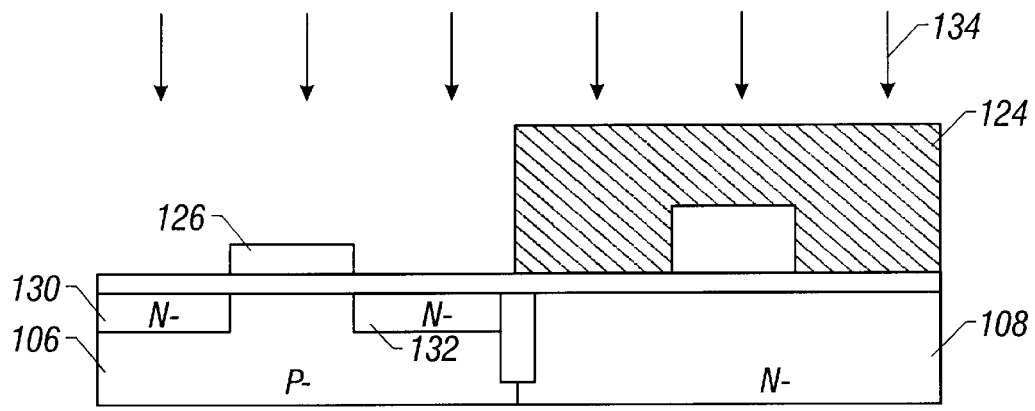

In FIG. 1F, lightly doped source and drain regions 130 and 132 are implanted into active region 106 by subjecting the structure to ion implantation of phosphorus, indicated by arrows 134, at a dose in the range of $1\times10^{13}$ to $5\times10^{14}$ atoms/cm$^2$ and an energy of 2 to 35 kiloelectron-volts, using gate 126 as an implant mask for active region 106 and using photoresist layer 124 as an implant mask for active region 108. As a result, lightly doped source and drain regions 130 and 132 are implanted into active region 106 outside gate 126, and the doping in active region 108 is unchanged. Lightly doped source and drain regions 130 and 132 are doped N− with a phosphorus concentration in the range of about $1\times10^{17}$ to $1\times10^{18}$ atoms/cm$^3$, are self-aligned with the opposing sidewalls of gate 126, and provide the initial source/drain doping in active region 106.

Figure 1G:
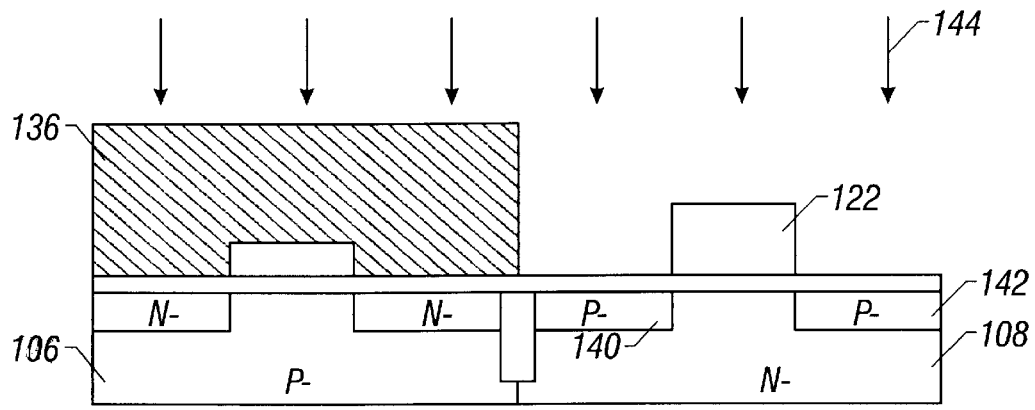

In FIG. 1G, photoresist layer 124 is stripped, and photoresist layer 136 is deposited over the structure. The photolithographic system uses a third reticle to irradiate photoresist layer 136 with a third image pattern, the irradiated portions of photoresist layer 136 are removed, and photoresist layer 136 covers the entire active region 106 but contains an opening above the entire active region 108. Thereafter, lightly doped source and drain regions 140 and 142 are implanted into active region 108 by subjecting the structure to ion implantation of boron, indicated by arrows 144, at a dose in the range of $1\times10^{13}$ to $5\times10^{14}$ atoms/cm$^2$ and an energy of 10 to 25 kiloelectron-volts, using gate 122 as an implant mask for active region 108, and using photoresist layer 136 as an implant mask for active region 106. As a result, lightly doped source/drain regions 140 and 142 are implanted into active region 108 outside gate 122, and the doping in active region 106 is unchanged. Lightly doped source and drain regions 140 and 142 are doped P− with a boron concentration in the range of about $1\times10^{17}$ to $1\times10^{18}$ atoms/cm$^3$, are self-aligned with the opposing sidewalls of gate 122, and provide the initial source/drain doping in active region 108.

Figure 1H:
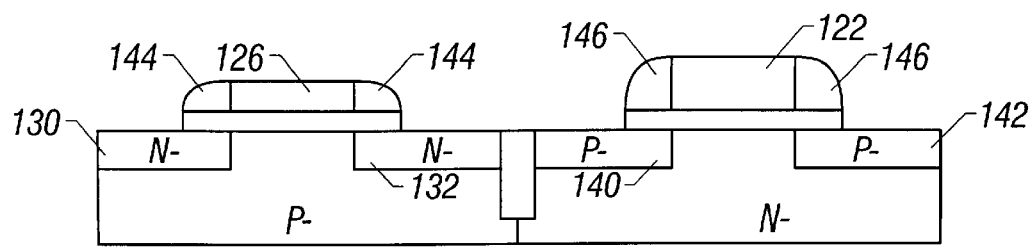

In FIG. 1H, photoresist layer 136 is stripped, an oxide layer with a thickness of 30 to 150 angstroms is thermally grown on the exposed surfaces using tube growth at a temperature of 700 to 1000° C. in an O$_2$ containing ambient, and then another oxide layer with a thickness of 1000 to 1500 angstroms is conformally deposited over the structure by plasma enhanced chemical vapor deposition at a temperature in the range of 300 to 450° C. Thereafter, the structure is subjected to an anisotropic reactive ion etch that forms oxide spacers 144 adjacent to the opposing sidewalls of gate 126 and oxide spacers 146 adjacent to the opposing sidewalls of gate 122. Spacers 144 cover portions of lightly doped source and drain regions 130 and 132, and spacers 146 cover portions of lightly doped source and drain regions 140 and 142. Of importance, spacers 146 are wider than spacers 144. That is, the lateral distance that spacers 146 extend from the opposing sidewalls of gate 122 is greater than the lateral distance that spacers 144 extend from the opposing sidewalls of gate 126. For illustration purposes, spacers 146 have a width of about 800 angstroms, and spacers 144 have a width of about 500 angstroms.

The dimensions of the spacers depend on several variables, including the thickness and lengths of the gates, the thickness of the blanket layer of spacer material, and the duration of the spacer etch. In the present embodiment, spacers 146 have a greater width than spacers 144 solely due to gate 122 having a greater thickness than gate 126.

Figure 1I:
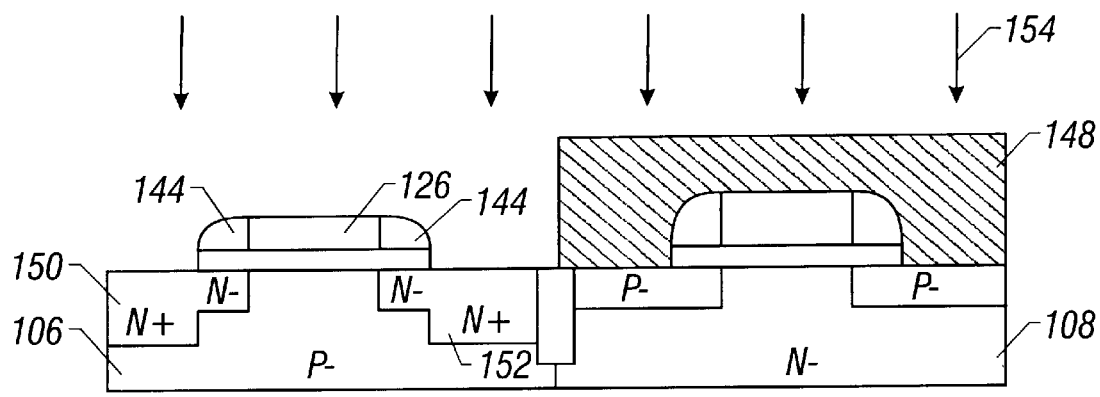

In FIG. 1I, photoresist layer 148 is deposited over the structure. The photolithographic system uses the second reticle to irradiate photoresist layer 148 with the second image pattern, the irradiated portions of photoresist layer 148 are removed, and photoresist layer 148 covers the entire active region 108 but contains an opening above the entire active region 106. Thereafter, heavily doped source and drain regions 150 and 152 are implanted into active region 106 by subjecting the structure to ion implantation of arsenic, indicated by arrows 154, at a dose in the range of $1\times10^{15}$ to $5\times10^{15}$ atoms/cm$^2$ and an energy of 10 to 80 kiloelectron-volts, using gate 126 and spacers 144 as an implant mask for active region 106, and using photoresist layer 148 as an implant mask for active region 108. As a result, heavily doped source and drain regions 150 and 152 are implanted in active region 106 outside spacers 144, and the doping in active region 108 is unchanged. Heavily doped source and drain regions 150 and 152 are doped N+ with an arsenic concentration in the range of about $1\times10^{18}$ to $1\times10^{20}$ atoms/cm$^3$ and are self-aligned with spacers 144.

Figure 1J:
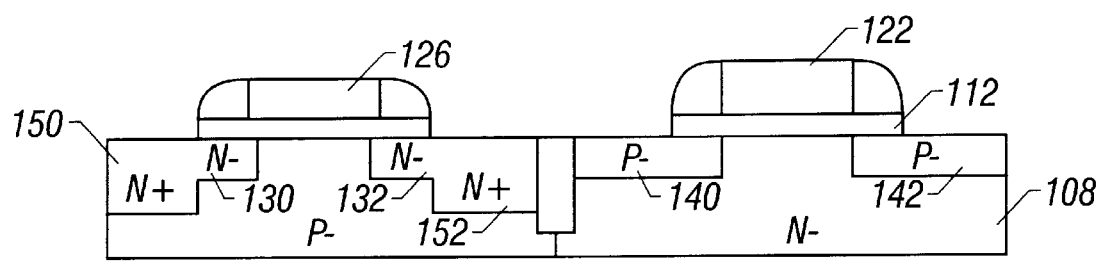

In FIG. 1J, photoresist layer 148 is stripped, and the device is annealed to remove crystalline damage and to drive-in and activate the implanted dopants by applying a rapid thermal anneal on the order of 950 to 1050° C. for 10 to 30 seconds. During this anneal, boron diffuses more rapidly than phosphorus and far more rapidly than arsenic. As a result, lightly doped source and drain regions 140 and 142 diffuse slightly further than lightly doped source and drain regions 130 and 132, and heavily doped source and drain regions 150 and 152 exhibit very little diffusion. Accordingly, the channel junctions provided by lightly doped source and drain regions 130 and 132 remain substantially aligned with the sidewalls of gate 126, and the channel junctions provided by lightly doped source and drain regions 140 and 142 remain substantially aligned with the sidewalls of gate 122. Moreover, since gate 122 is relatively thick, no appreciable amount of the boron in gate 122 diffuses into gate oxide 112 or through gate oxide 112 into active region 108, and gate 126 is essentially free of boron. Thus, little or no boron penetration occurs.

Figure 1K:
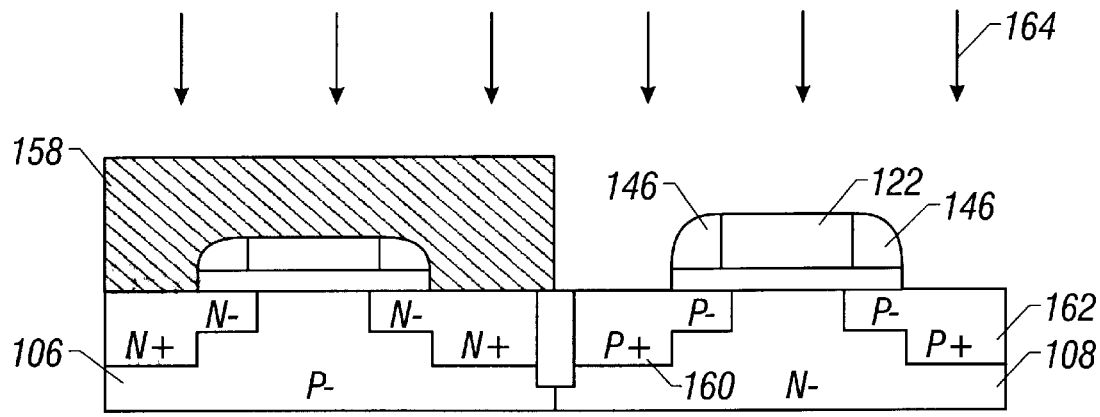

In FIG. 1K photoresist layer 158 is deposited over the structure. The photolithographic system uses the third reticle to irradiate photoresist layer 158 with the third image pattern, the irradiated portions of photoresist layer 158 are removed, and photoresist layer 158 covers the entire active region 106 but contains an opening above the entire active region 108. Thereafter, heavily doped source and drain regions 160 and 162 are implanted into active region 108 by subjecting the structure to ion implantation of boron, indicated by arrows 164, at a dose in the range of $1\times10^{15}$ to $5\times10^{15}$ atoms/cm$^2$ and an energy of 15 to 30 kiloelectron-volts, using gate 122 and spacers 146 as an implant mask for active region 108, and using photoresist layer 158 as an implant mask for active region 106. As a result, heavily doped source and drain regions 160 and 162 are implanted in active region 108 outside spacers 146, and the doping in active region 106 is unchanged. Heavily doped source and drain regions 160 and 162 are doped P+ with a boron concentration in the range of about $1\times10^{18}$ to $1\times10^{20}$ atoms/cm$^3$ and are self-aligned with spacers 146.

Figure 1L:
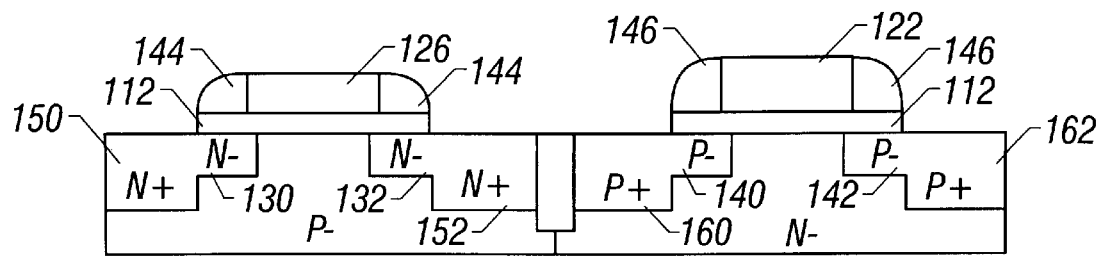

In FIG. 1L, photoresist layer 158 is stripped, and the device is annealed to remove crystalline damage and to drive-in and activate the boron indicated by arrows 164 by applying a rapid thermal anneal on the order of 900 to 1050° C. for 10 to 30 seconds. During this anneal, boron diffuses more rapidly than phosphorus and far more rapidly than arsenic. As a result, lightly doped source and drain regions 140 and 142 diffuse slightly further than lightly doped source and drain regions 130 and 132, and heavily doped source and drain regions 160 and 162 diffuse much further than heavily doped source and drain regions 150 and 152. Accordingly, the channel junctions provided by lightly doped source and drain regions 130 and 132 remain substantially aligned with the sidewalls of gate 126, and the channel junctions provided by lightly doped source and drain regions 140 and 142 remain substantially aligned with the sidewalls of gate 122.

During this anneal, the channel junctions of lightly doped source and drain regions 140 and 142 diffuse only slightly more than the channel junctions of lightly doped source and drain regions 130 and 132, but the portions of lightly doped source and drain regions 140 and 142 consumed by heavily doped source and drain regions 160 and 162, respectively, is far greater than the portions of lightly doped source and drain regions 130 and 132 consumed by heavily doped source and drain regions 150 and 152, respectively, during this anneal or the previous anneal. Thus, this anneal reduces the size of lightly doped source and drain regions 140 and 142 relative to lightly doped source and drain regions 130 and 132. In the present embodiment, it is desirable for lightly doped source and drain regions 130, 132, 140 and 142 to have similar sizes after this anneal occurs in order to provide the desired tradeoff between reduced hot carrier effects and increased parasitic resistance. Advantageously, since spacers 146 are substantially wider than spacers 144, lightly doped source and drain regions 140 and 142 are substantially wider than lightly doped source and drain regions 130 and 132 before this anneal occurs. This offsets the effects of this anneal, so that after this anneal occurs, lightly doped source and drain regions 130, 132, 140 and 142 have similar widths.

Moreover, since gate 122 is relatively thick, no appreciable amount of the boron in gate 122 diffuses into gate oxide 112 or through gate oxide 1 12 into active region 108. Thus, the P-channel device exhibits little or no boron penetration. With respect to the N-channel device, gate 126 is essentially free of boron, and the phosphorus and arsenic in gate 126 do not penetrate gate oxide 112 during high temperature processing.

In this manner, an N-channel enhancement-mode IGFET is formed with a source (consisting of lightly and heavily doped source regions 130 and 150) and a drain (consisting of lightly and heavily doped drain regions 132 and 152) controlled by gate 126. Similarly, a P-channel enhancement-mode IGFET is formed with a source (consisting of lightly and heavily doped source regions 140 and 160) and a drain (consisting of lightly and heavily doped drain regions 142 and 164) controlled by gate 122. Advantageously, the IGFETs have lightly doped sources and drains with the desired sizes, and boron penetration is suppressed.

Providing low resistance contacts for the gate, source and drain can be accomplished using a refractory metal silicide. In one approach, a thin layer of refractory metal is deposited over the structure, and heat is applied to form silicide contacts wherever the refractory metal is adjacent to silicon (including single crystal silicon and polysilicon). Thereafter, an etch is applied that removes unreacted refractory metal over the spacers to prevent bridging silicide contacts for the gate, source and drain. Various silicides such as titanium silicide (TiSi$_2$), tungsten silicide (WSi$_2$), molybdenum silicide ($MoSi_2$), cobalt silicide ($CoSi_2$) and tantalum silicide ($TaSi_2$) have been used for this purpose. For instance, the sheet resistance of titanium silicide is as low as 3 to 6 Ω/sq, whereas heavily doped polysilicon exhibits a sheet resistance on the order of 15 to 30 Ω/sq. Another advantage to this approach is that the silicide contacts for the gate, source and drain are formed simultaneously and are self-aligned by the spacers. This self-aligned silicide is referred to as salicide.

Further processing steps in the fabrication of IGFETs typically include forming a thick dielectric layer over the active regions, forming contact windows in the thick dielectric layer to expose the salicide contacts, forming conductive plugs in the contact windows, and forming additional layers of interconnect metallation (such as metal-1 through metal-5), conductive plugs, and interlayer dielectrics above the structure. Preferably, the thick dielectric layer is planarized by chemical-mechanical polishing in order to remove surface non-uniformities created by the difference in thickness between the gates. In addition, earlier or subsequent high-temperature process steps can be used to supplement or replace the anneal step to provide the desired anneal, activation, and drive-in functions. These further processing steps are conventional. Likewise the principal processing steps disclosed herein may be combined with other steps apparent to those skilled in the art.

In the previous embodiments, the difference in gate thicknesses has been provided by a subtractive process, in which a gate material is etched to form a first pillar and the second gate, and then an upper level of the first pillar is removed to form the first gate. Alternatively, if desired, the difference in gate thicknesses can be provided by an additive process in which a gate material is etched to form the first gate and a lower level of the second gate, and then an upper level of the second gate is formed on the lower level of the second gate to form the second gate without changing the thickness of the first gate. Several examples of such additive processes are listed below.

In a first additive process, after the first gate and the lower level of the second gate are formed, an insulating layer is deposited over the structure and polished until the first gate and the lower level of the second gate are exposed, a layer of conductive material is deposited over the structure and on the first gate, the lower level of the second gate and the insulating layer, a masking layer is deposited on the conductive material, an opening is formed in the masking layer above the first gate, and a region of the conductive material on the first gate is etched through the opening in the masking layer such that the conductive material that remains on the lower level of the second gate provides the upper level of the second gate.

In a second additive process, after the first gate and the lower level of the second gate are formed, an insulating layer is deposited over the first gate and the lower level of the second gate, an opening is formed in the insulating layer that exposes the lower level of the second gate without exposing the first gate, a layer of conductive material is deposited on the insulating layer and into the opening in the insulating layer without being deposited on the first gate, and the conductive material is polished to remove the conductive material outside the opening in the insulating layer such that the conductive material that remains in the opening in the insulating layer provides the upper level of the second gate.

In a third additive process, after the first gate and the lower level of the second gate are formed, an insulating layer is deposited over the first gate and the lower level of the second gate, an opening is formed in the insulating layer that exposes the lower level of the second gate without exposing the first gate, and epitaxial silicon is selectively deposited in the opening in the insulating layer without being deposited over the first gate to provide the upper level of the second gate. It should be noted that there are basically two types of selective epitaxial deposition processes. In "Type 1" processes, epitaxial growth occurs only on the exposed silicon and no growth occurs on the exposed oxide. In "Type 2" processes, epitaxial growth occurs on both the exposed silicon and the exposed oxide. In the third additive process, the epitaxial silicon is deposited on the exposed polysilicon using a Type 1 process. $SiCl_4$ and $SiHCl_3$ provide suitable silicon sources. $SiH_2Cl_2$ and $SiH_4$ also provide suitable silicon sources if HCl or $Cl_2$ is added to the reaction. Furthermore, bromine based silicon compounds such as $SiHBr_3$ and $SiBr_4$ have shown improved selectivity over their chlorinated counterparts. Factors that enhance the selective nature of a Type 1 process include reduced pressure, increased temperature, and decreased mole fraction of the silicon source in the gas stream. Selective deposition of epitaxial silicon is well-known in the art.

The difference in gate thicknesses can also be provided by an additive process in which a first gate material is etched to form a lower level of the second gate, and then a second gate material is etched to form the first gate and an upper level of the second gate. As an example of such an additive process, a first layer of conductive material is deposited over the structure, a first masking layer is formed on the first layer of conductive material, the first layer of conductive material is etched through openings in the first masking layer to form the lower level of the second gate without forming any portion of the first gate, the first masking layer is removed, a second layer of conductive material is deposited over the structure, a second masking layer is formed on the second layer of conductive material, the second layer of conductive material is etched through openings in the second masking layer to form the first gate and the upper level of the second gate, and the second masking layer is removed. In this fashion, the first gate consists of a single layer, and the second gate consists of upper and lower layers.

As an alternative to both additive and subtractive processes, the difference in gate thicknesses can be provided by depositing a first layer of conductive material over the first active region, depositing a second layer of conductive material over the second active region, with the first and second layers of conductive materials having different thicknesses, forming a single masking layer over the first and second layers of conductive materials, and then simultaneously etching the first and second layers of conductive materials through openings in the masking layer to form the first and second gates.

The present invention includes further variations to the embodiment described above. For instance, the upper level of pillar 120 can be removed by other techniques such as thermal oxidation. The difference in gate thicknesses and spacer widths is largely a matter of design choice, although it is preferred that about one-third to one-half of pillar 120 be removed to form gate 126. The active regions can be isolated using various techniques such as LOCOS oxidation.

Furthermore, the gate material can be various conductors, the gate insulator and spacers can be various dielectrics such as silicon dioxide, silicon nitride and silicon oxynitride, and the etch masks can be hard masks patterned by photoresist. The N-channel and P-channel devices can be symmetrical or asymmetrical transistors, that is, with or without symmetrical source/drain doping. Asymmetrical transistors with lightly doped drain regions without lightly doped source regions are well-known in the art. In addition, the LDDs are not essential. The dopants can be introduced in various sequences. For instance, lightly doped source and drain regions 130 and 132 can be implanted before the anisotropic etch is applied to pillar 120, and lightly doped source and drain regions 140 and 142 can be implanted before lightly doped source and drain regions 130 and 132 are implanted. Suitable N-type dopants include arsenic and phosphorus; suitable P-type dopants include boron $B_{10}$, boron $B_{11}$, and $BF_X$ species such as $BF_2$.

The invention is particularly well-suited for fabricating N-channel MOSFETs, P-channel MOSFETs and other types of IGFETs, particularly for high-performance microprocessors where high circuit density is essential. Although a single pair of N-channel and P-channel devices has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making N-channel and P-channel IGFETs, comprising the steps of:

providing a semiconductor substrate with a first active region of a first conductivity type and a second active region of a second conductivity type;

forming a first gate over the first active region and a second gate over the second active region, wherein the second gate has a substantially greater thickness than the first gate, wherein forming the first and second gates includes forming a uniformly thick gate material over the first and second active regions, etching the gate material to form a first pillar and the second gate, and then removing an upper level of the first pillar to form the first gate without changing the thickness of the second gate;

forming first spacers in close proximity to opposing sidewalls of the first gate and second spacers in close proximity to opposing sidewalls of the second gate, wherein the second spacers have a substantially greater width than the first spacers due to the second gate having a substantially greater thickness than the first gate; and forming a first source and a first drain of the second conductivity type in the first active region and a second source and a second drain of the first conductivity type in the second active region.

2. The method of claim 1, wherein forming the first and second gates includes forming the first gate and a lower level of the second gate, and then forming an upper level of the second gate without changing the thickness of the first gate.

3. The method of claim 2, wherein the first gate and the lower level of the second gate are formed from a single layer of gate material and have essentially identical thicknesses.

4. The method of claim 1, wherein forming the first and second gates includes forming a lower level of the second gate without forming any portion of the first gate, and then forming the first gate and an upper level of the second gate.

5. The method of claim 4, wherein the first gate and the upper level of the second gate are formed from a single layer of gate material and have essentially identical thicknesses.

6. The method of claim 1, wherein forming the first and second gates includes depositing a first gate material with a first thickness over the first active region, and depositing a second gate material with a second thickness over the second active region, such that the first gate consists of the first gate material and the second gate consists of the second gate material.

7. The method of claim 1, wherein the N-channel IGFET is an enhancement-mode device formed in the first active region, and the P-channel IGFET is an enhancement-mode device formed in the second active region.

8. The method of claim 1, including fabricating an integrated circuit chip that includes the N-channel and P-channel IGFETs.

9. The method of claim 1, including fabricating an electronic system that includes the a microprocessor, a memory, a system bus, and the N-channel and P-channel IGFETs.

10. A method of making N-channel and P-channel IGFETs, comprising the steps of:

providing a semiconductor substrate with a first active region of a first conductivity type and a second active region of a second conductivity type;

forming a uniformly thick gate material over the first and second active regions; forming a first gate from a portion of the gate material over the first active region and a second gate from a portion of the gate material over the second active region, wherein the second gate has a substantially greater thickness than the first gate, wherein forming the first and second gates includes etching the gate material to form a first pillar and the second gate, and then removing an upper level of the first pillar to form the first gate;

forming first spacers in close proximity to opposing sidewalls of the first gate and second spacers in close proximity to opposing sidewalls of the second gate, wherein the second spacers have a substantially greater width than the first spacers due to the second gate having a substantially greater thickness than the first gate; and forming a first source and a first drain of the second conductivity type in the first active region and a second source and a second drain of the first conductivity type in the second active region.

11. The method of claim 1, wherein removing the upper level of the first pillar includes applying an anisotropic etch to the first pillar without applying the anisotropic etch to the second gate.

12. The method of claim 11, wherein the first pillar and the second gate have essentially identical thicknesses.

13. The method of claim 12, wherein the anisotropic etch removes at least one-third of the first pillar.

14. The method of claim 10, wherein the first and second gates have essentially identical lengths.

15. The method of claim 10, wherein the first spacers are formed adjacent to the opposing sidewalls of the first gate, and the second spacers are formed adjacent to the opposing sidewalls of the second gate.

16. The method of claim 10, wherein the first conductivity type is P-type, and the second conductivity type is N-type.

17. The method of claim 10, wherein the N-channel and P-channel IGFETs are enhancement-mode devices.

18. The method of claim 10, wherein the gate material is polysilicon, and the first and second spacers are silicon dioxide.

19. A method of making N-channel and P-channel IGFETs, comprising the steps of:

providing a semiconductor substrate with a P-type active region and an N-type active region;

forming a gate insulator on the P-type and N-type active regions;

forming a uniformly thick gate material on the gate insulator and over the P-type and N-type active regions;

forming a first etch mask over the gate material, wherein the first etch mask includes openings above a first portion of the gate material over the P-type active region, and the first etch mask includes openings above a second portion of the gate material over the N-type active region;

etching the gate material through the openings in the first etch mask to form a first pillar from an unetched portion of the gate material over the P-type active region and a second gate from an unetched portion of the gate material over the N-type region;

forming a second etch mask over the substrate, wherein the second etch mask includes an opening above all of the first pillar, and the second etch mask covers all of the second gate;

etching the first pillar through the opening in the second etch mask thereby removing an upper portion of the first pillar to form a first gate from a lower portion of the pillar over the P-type active region without removing essentially any of the second gate;

forming first spacers in close proximity to opposing sidewalls of the first gate and second spacers in close proximity to opposing sidewalls of the second gate, wherein the second spacers have a substantially greater width than the first spacers due to the second gate having a substantially greater thickness than the first gate; and forming an N-type source and an N-type drain in the P-type active region and a P-type source and a P-type drain in the N-type active region.

20. The method of claim 19, wherein forming the N-type drain includes implanting an N-type dopant into the P-type active region using the second etch mask as an implant mask for the N-type active region.

21. The method of claim 19, wherein forming the sources and the drains includes:

implanting a light dose of an N-type dopant into the P-type active region using the first gate as an implant mask;

implanting a light dose of a P-type dopant into the N-type active region using the second gate as an implant mask; then forming the first and second spacers; then implanting a heavy dose of an N-type dopant into the P-type active region using the first gate and the first spacers as an implant mask; and implanting a heavy dose of a P-type dopant into the N-type active region using the second gate and the second spacers as an implant mask.

22. The method of claim 19, wherein forming the first and second spacers includes depositing a blanket layer of spacer material over the substrate, and applying an anisotropic etch to the spacer material without using an etch mask for the spacer material.

23. The method of claim 19, wherein the first pillar and the second gate have essentially identical thicknesses, and the upper portion of the first pillar has a thickness in the range of about one-third to one-half of the first pillar.

24. The method of claim 19, wherein a length between the opposing sidewalls of the first gate is essentially identical to a length between the opposing sidewalls of the second gate.

25. The method of claim 19, wherein the P-type and N-type active regions are adjacent to opposite sides of a dielectric isolation region in the substrate.

26. The method of claim 19, wherein the gate material is polysilicon, the first and second etch masks are photoresist.

27. The method of claim 19, wherein the N-type dopants include at least one of phosphorus and arsenic, and the P-type dopants include boron.

28. The method of claim 19, wherein the steps are performed in the sequence set forth.

29. A method of making N-channel and P-channel enhancement-mode IGFETs, comprising the steps of:

providing a semiconductor substrate with P-type and N-type active regions;

forming a gate oxide on the P-type and N-type active regions;

depositing a uniformly thick polysilicon layer on the gate oxide and over the N-type and P-type active regions;

forming a first photoresist layer over the polysilicon layer, wherein the first photoresist layer includes openings above a first portion of the polysilicon layer over the P-type active region, and the first photoresist layer includes openings above a second portion of the polysilicon layer over the N-type active region;

applying a first etch to remove portions of the polysilicon layer beneath the openings in the first photoresist layer, wherein an unetched portion of the polysilicon layer over the P-type region forms a first pillar, an unetched portion of the polysilicon layer over the N-type active region forms a second gate, and the first pillar and second gate have essentially identical thicknesses;

removing the first photoresist layer;

forming a second photoresist layer over the substrate, wherein the second photoresist layer includes an opening above all of the first pillar, and the second photoresist layer covers all of the second gate;

applying a second etch to remove an upper portion of the first pillar beneath the opening in the second photoresist layer without removing a lower portion of the first pillar and without removing essentially any of the second gate, wherein the upper portion of the first pillar has a thickness in the range of about one-third to one-half of the first pillar, and the lower portion of the first pillar forms a first gate;

removing the second photoresist layer;

implanting a first N-type dopant into the P-type active region using the first gate as an implant mask for the P-type active region without implanting essentially any of the first N-type dopant into the N-type active region;

implanting a first P-type dopant into the N-type active region using the second gate as an implant mask for the N-type region without implanting essentially any of the first P-type dopant into the P-type active region;

depositing a spacer material over the substrate;

applying a third etch to the spacer material without using an etch mask for the spacer material, wherein unetched portions of the spacer material over the P-type active region form first spacers adjacent to opposing sidewalls of the first gate, unetched portions of the spacer material over the N-type active region form second spacers adjacent to opposing sidewalls of the second gate, and the second spacers have a substantially greater width than the first spacers due to the second gate having a substantially greater thickness than the first gate;

implanting a second N-type dopant into the P-type active region using the first gate and the first spacers as an implant mask for the P-type active region without implanting essentially any of the second N-type dopant into the N-type active region;

implanting a second P-type dopant into the N-type active region using the second gate and the second spacers as an implant mask for the N-type region without implanting essentially any of the second P-type dopant into the P-type active region; and applying a high temperature anneal to drive-in and activate at least some of the dopants.

30. The method of claim 29, including implanting the first N-type dopant into the P-type active region using the second photoresist layer as an implant mask for the N-type active region.

31. The method of claim 29, wherein the P-type and N-type active regions are adjacent to opposite sides of a dielectric isolation region in the substrate.

32. The method of claim 29, wherein the first and second N-type dopants include at least one of phosphorus and arsenic, and the first and second P-type dopants include boron.

33. The method of claim 29, wherein essentially none of the first and second P-type dopants transfer through the second gate into the N-type active region.

* * * * *